(12) United States Patent
Fujiwara et al.

(10) Patent No.: US 6,334,200 B1
(45) Date of Patent: Dec. 25, 2001

(54) TESTABLE INTEGRATED CIRCUIT, INTEGRATED CIRCUIT DESIGN-FOR-TESTABILITY METHOD, AND COMPUTER-READABLE MEDIUM STORING A PROGRAM FOR IMPLEMENTING THE DESIGN-FOR-TESTABILITY METHOD

(75) Inventors: Hideo Fujiwara, Kyoto; Toshimitsu Masuzawa, Hyogo; Satoshi Ohtake, Ikoma, all of (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 09/203,372

(22) Filed: Dec. 2, 1998

(30) Foreign Application Priority Data

Dec. 3, 1997 (JP) .................................................... 9-332832

(51) Int. Cl.[7] .............................. G01R 31/28; G06F 11/00
(52) U.S. Cl. ................................................................ 714/738
(58) Field of Search ............................................. 714/738

(56) References Cited

U.S. PATENT DOCUMENTS

| | | | |
|---|---|---|---|
| 4,317,200 | * 2/1982 | Wakatsuki et al. | 714/736 |
| 5,528,604 | * 6/1996 | El-Maleh et al. | 714/738 |
| 5,539,680 | * 7/1996 | Palnitkar et al. | 703/13 |
| 6,028,988 | * 2/2000 | Asaka | 716/4 |
| 6,059,837 | * 5/2000 | Kukula et al. | 703/27 |
| 6,070,258 | * 5/2000 | Asaka | 714/724 |
| 6,074,428 | * 6/2000 | Petler | 716/2 |

FOREIGN PATENT DOCUMENTS

| | | |
|---|---|---|
| 03-134577 | 6/1991 | (JP) . |
| 04-147075 | 5/1992 | (JP) . |
| 06-027204 | 2/1994 | (JP) . |
| 06-138188 | 5/1994 | (JP) . |

OTHER PUBLICATIONS

Chickermane V et al: "Non–Scan Design–For–Testability Techniques For Sequential Circuits" Proceedings For The Design Automation Conference, Dallas, Jun. 14–18, 1993, No. Conf. 30, Jun. 14, 1993 pp. 236–241.

Pomeranz I et al: "Design And Synthesis For Testability Of Synchronous Sequential Circuits Based On Strong–Connectivity" Proceedings Of The International Symposium On Fault Tolerant Comput (FTCS), Toulouse, Jun. 22–24, 1993 N. Symp. 23, Jun. 22, 1993. pp. 492–501 Institute Of Electrical And Electronics Engineers p. 494.

Liang H. C et al: "Identifying Invalid States For Sequential Circuit Test Generation" IEEE Transactions On Computer Aided Design Of Integrated Circuits And Systems, vol. 16, No. 9, Sep. 1, 1997, pp. 1025–1033.

J.E. Chen, Hsing–Chung Liang, Chung Len Lee, "Invalid state identification for sequential circuit test generation", Proceedings of the Fifth Asian Test Symposium 1996, On pp. 10–15, Nov. 20–22, 1996; IEEE 1996.*

(List continued on next page.)

*Primary Examiner*—Albert DeCady
*Assistant Examiner*—Joseph Torres
(74) *Attorney, Agent, or Firm*—McDermott, Will & Emery

(57) ABSTRACT

Apparatus for testing integrated circuits containing a controller or other sequential circuit at actual operating speed while minimizing the length of the test sequence and achieving high fault coverage are provided. The states of a state register are assumed controllable and observable, and a set of test patterns is obtained for a combinational circuit not containing said state register. An invalid-state generation logic circuit is added for generating invalid states, which are states contained in the generated test patterns but cannot be set by a normal transition from the reset state. A multiplexer is added for selecting the output of a next-state generation logic circuit or the invalid-state generation logic circuit for input to the state register based on a state transition mode selection signal. Signals corresponding to pseudo-primary outputs during test generation are made observable, and the multiplexer output signal is externally detectable as a state output signal.

10 Claims, 12 Drawing Sheets

OTHER PUBLICATIONS

J.E. Chen, Hsing–Chung Liang, Chung Len Lee, "Identifying invalid states for sequential circuit test Generation", Computer–Aided Design of Integrated Circuits and Systems, IEEE Transactions on pp. 1025–1033, Sep. 1997, vol. 16 Issue: 9.*

S. Devadas and K. Keutzer "A unified approach to the synthesis of fully testable sequential machines", System Sciences, 1990, Proceedings of the Twenty–Third Annual Hawaii International Conference on pp. 427–435, vol. 1, Jan. 2–5, 1990.*

S. Devadas and K. Keutzer "Boolean minimization and algebraic factorization procedures for fully testable sequential machines", Computer–Aided Design, 1989, ICCAD–89, Digest of Technical Papers, 1989 IEEE International Conference on, 1989, pp. 208–221.*

H. Cho and F. Somenzi, "Sequential logic optimization based on state decomposition", Design Automation, 1993, with the European Event in ASIC Design. Proceedings. [4th] European Conference on , pp. 200–204, Feb. 22–25, 1993.*

* cited by examiner

Fig.2
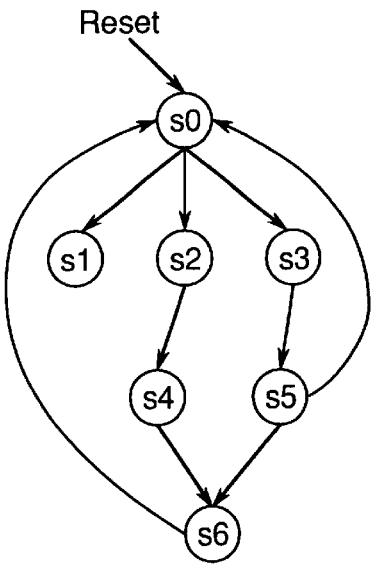
Fig.3
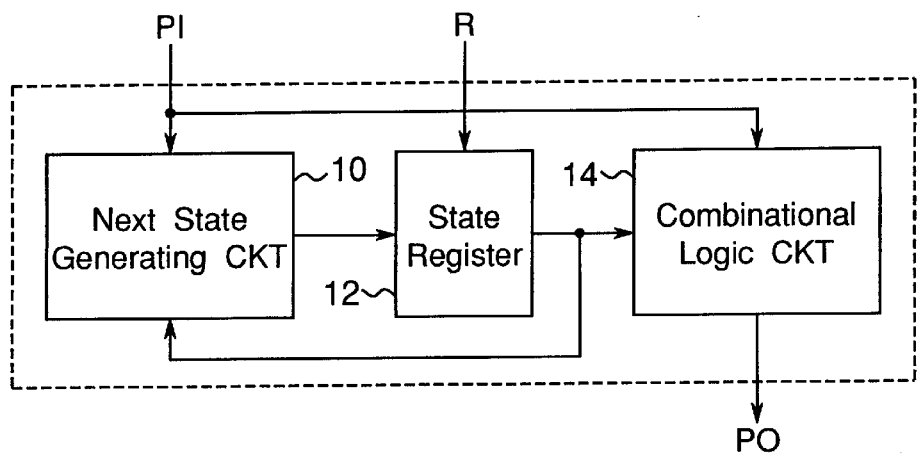
Fig.4
| State | Value of State Register |
|-------|-------------------------|
| s0 | 0000001 |
| s1 | 0000010 |
| s2 | 0000100 |
| s3 | 0001000 |
| s4 | 0010000 |
| s5 | 0100000 |
| s6 | 1000000 |

Fig. 8

| | No. | Value of PI | Value of SR | State of FSM |
|---|---|---|---|---|
| Inclusive of Valid State | 1 | 001100 | 0100000 | s5 |
| | 2 | 101101 | 0100000 | s5 |
| | 3 | 100110 | 0001000 | s3 |
| | 4 | 001110 | 0001000 | s3 |
| | ... | ... | ... | ... |
| | k | 101110 | 1000000 | s6 |
| Inclusive of Invalid State | k+1 | 101010 | 1011000 | —(iv4) |
| | k+2 | 111011 | 1011000 | —(iv4) |
| | k+3 | 101101 | 0101001 | —(iv1) |
| | k+4 | 000101 | 0101001 | —(iv1) |
| | ... | ... | ... | ... |
| | k+m | 001001 | 0110011 | —(iv3) |

Fig. 9

| CKT | No. of States | No. of FF | No. of Inputs | No. of Outputs | CKT Surface Area | Fault Coverage | Synthesis Time | Sequence Length |
|---|---|---|---|---|---|---|---|---|
| bbtas | 6 | 3 | 2 | 2 | 87.60 | 100 | 2.92 | 202 |
| dk27 | 7 | 3 | 1 | 2 | 92.00 | 100 | 0.74 | 102 |
| ex3 | 10 | 4 | 2 | 2 | 192.80 | 94.66 | 213.78 | 332 |
| ex5 | 9 | 4 | 2 | 2 | 183.70 | 93.05 | 414.04 | 232 |
| lion9 | 9 | 4 | 2 | 1 | 322.10 | 94.06 | 581.25 | 397 |
| s298 | 218 | 8 | 3 | 6 | 8720.80 | 18.99 | 174122.20 | 398 |

Fig. 10

| CKT | Test Gen. Time(sec) | | | Fault Coverage(%) | | | Test Seq. Length(%) | | |
|---|---|---|---|---|---|---|---|---|---|
| | Scan | Patel | Invention | Scan | Patel | Invention | Scan | Patel | Invention |
| bbtas | 0.15 | 0.32 | 0.15 | 100 | 100 | 100 | 71 | 120 | 25 |
| dk27 | 0.16 | 0.37 | 0.16 | 100 | 100 | 100 | 71 | 168 | 25 |
| ex3 | 0.45 | 1.82 | 0.45 | 100 | 100 | 100 | 237 | 574 | 68 |
| ex5 | 0.41 | 1.60 | 0.41 | 100 | 100 | 100 | 244 | 544 | 67 |
| lion9 | 0.52 | 1.60 | 0.52 | 100 | 100 | 100 | 239 | 528 | 63 |
| s298 | 263.92 | 9536.98 | 263.92 | 100 | 99.61 | 100 | 9890 | 36206 | 2444 |

Fig. 11

| CKT | No. of Multiplexers | | | Surface Area of Invalid State Synthesis Logic CKT | | |
|---|---|---|---|---|---|---|
| | Scan | Patel | Invention | Scan | Patel | Invention |
| bbtas | 3 | 2 | 3 | — | — | 8.20( 9.4%) |
| dk27 | 3 | 1 | 3 | — | — | 4.60( 5.0%) |
| ex3 | 2 | 2 | 2 | — | — | 49.20(25.5%) |
| ex5 | 4 | 2 | 4 | — | — | 20.90(11.4%) |
| lion9 | 4 | 2 | 4 | — | — | 32.30(10.0%) |
| s298 | 8 | 3 | 8 | — | — | 365.30( 4.2%) |

Fig.15
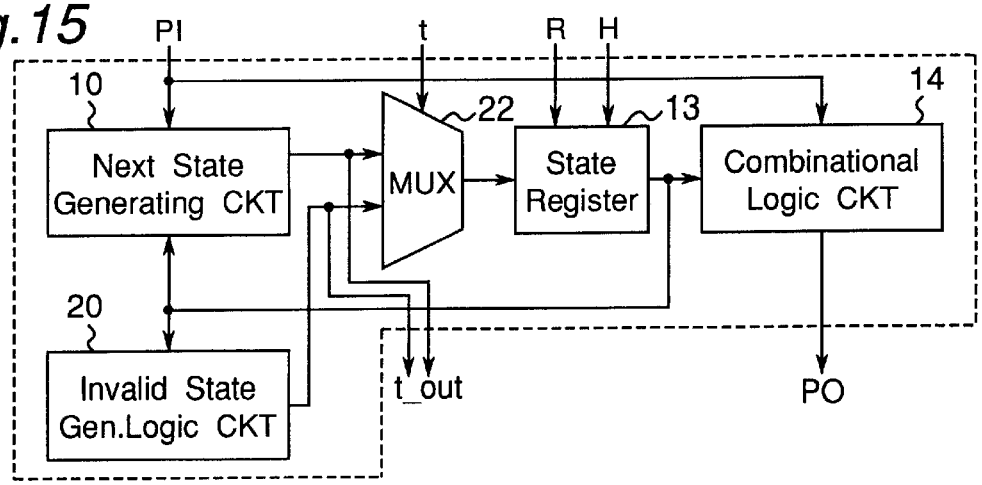
Fig.16
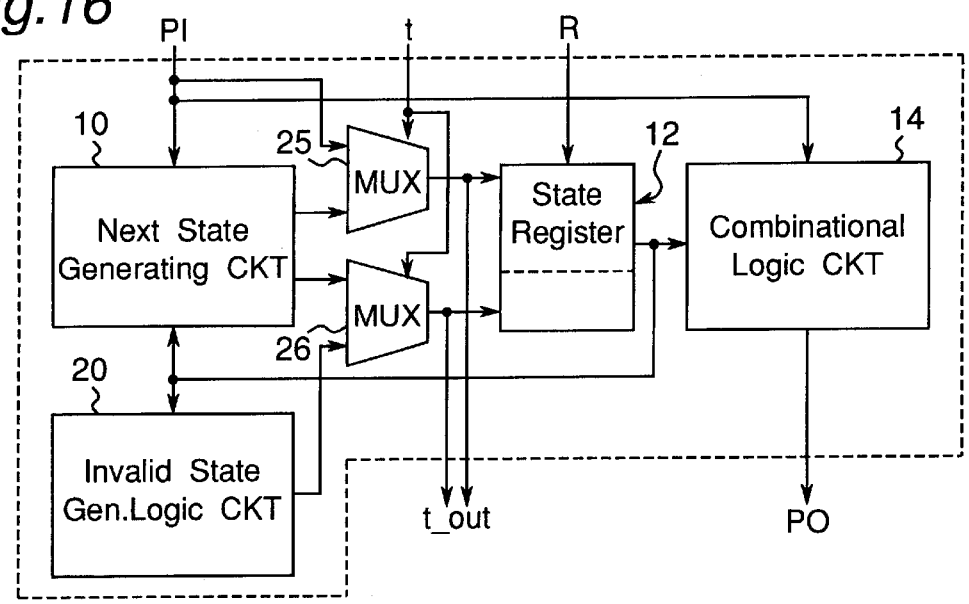
Fig.17
| CKT | Surface Area of Invalid State Synthesis Logic CKT |
|---|---|
| bbtas | 1.20( 1.4%) |
| dk27 | 1.20( 1.3%) |
| ex3 | 11.70( 6.1%) |
| ex5 | 12.90( 7.0%) |
| lion9 | 1.20( 0.4%) |
| s298 | 255.60( 2.9%) |

TESTABLE INTEGRATED CIRCUIT, INTEGRATED CIRCUIT DESIGN-FOR-TESTABILITY METHOD, AND COMPUTER-READABLE MEDIUM STORING A PROGRAM FOR IMPLEMENTING THE DESIGN-FOR-TESTABILITY METHOD

BACKGROUND OF THE INVENTION

1. Field of the Invention

The present invention relates to the testability design of integrated circuits, and particularly to the testability design of integrated circuits containing a controller or other sequential circuit programmed as a finite state machine at the register transfer level.

2. Description of the Related Art

Integrated circuit (IC) logic devices are subjected to function tests after manufacture to check for faults. Faults are detected by applying a particular input sequence to the IC being tested (the device under testing), and detecting a change in the output sequence, because the output sequence will be different when there is a fault and when there is not a fault. The input sequence used for testing is known as the test sequence. One measure used for evaluating test sequence generation (test generation) is fault coverage of fault efficiency, which is defined as:

DF+UDF/F

Wherein DF represents the number of detected faults, UDF represents the number of undetectable faults and F represents the total number of faults.

Note that a fault coverage rating of 100% is referred to as total fault coverage.

Test generation algorithms for automatically generating test patterns (or test sequences) used for testing integrated circuit logic devices are known from the literature. Efficient test generation algorithms for combinational circuit test generation have also been proposed (see Fujiwara, H., "Logic Testing and Design for Testability," The MIT Press, 1985).

It is also possible to achieve total fault coverage in a practical test generation time for combinational circuits. With sequential circuits, however, the number of states is $2^n$ where n is the number of flip-flops. Test generation for sequential circuits therefore requires significant time, and it is generally difficult to achieve the total fault coverage.

To address this problem, full-scan design-for-testability and non-scan design-for-testability methods for automatically designing and modifying testable circuits have been proposed as design techniques for implementing controllers' and other sequential circuits in an integrated circuit.

The full-scan design-for-testability is described in, for example, the above-cited "Logic Testing and Design for Testability," and is described briefly below with reference to FIG. 22.

A controller or other sequential circuit comprises a state register 102 and combinational circuit 100 as shown in FIG. 22. In full-scan design-for-testability, all flip-flops in the state register 102 are replaced by scannable flip-flops. The flip-flops are externally controllable and observable. More specifically, the state register 102 is replaced by a scannable register 103 having scan-in Si and scan-out SO contacts. During testing, this arrangement enables the state of the scannable state register 103 to be controlled to a desired state by controlling the scan-in SI contact, and enables the value resulting from that input to be observed using the scan-out SO contact. It is thus also possible to generate tests for combinational circuits 110 in which the scannable state register 103 is replaced by a pseudo-primary input PPI and a pseudo-primary output PPO as shown in FIG. 24.

It is therefore possible to use a test generation algorithm for a combinational circuit, shorten the test generation time compared with the original sequential circuit (FIG. 22), and achieve total fault coverage.

It will also be obvious, however, that the test sequence length increases when as the number of flip-flops in the state register increases. Each time the system clock advances, it is also necessary apply an input vector to the state register, and sequentially read and observe (scan-out) the content (scan-in) of the state register. The problem with full-scan design-for-testability, therefore, is that testing at the actual operating speed is not possible.

The non-scan design-for-testability method was proposed by Chickermane, et al., to address the problem of testing at the actual operating speed (see Chickermane, V., E. M. Rudnick, P. Banerjee, and J. H. Patel, "Non-Scan Design-for-Testability Techniques for Sequential Circuits," ACM/ICEE 30th Design Automation Conference, pp. 236–241, 1993). As shown in FIG. 25, Chickermane et al. divide the one state register into two state registers, a first register 102a having only as many flip-flops as inputs thereto, and a second register 102b having the remaining flip-flops A multiplexer 122 is also added for improving testability by externally setting the value of the first register 102a during testing.

This non-scan design-for-testability method enables testing at the actual operating speed, but it is difficult to set all states of the state register to the desired states due to practical limitations on the number of primary input pins. The problem with this method is thus that test generation for sequential circuits is necessary, high fault coverage cannot be achieved, and the test sequence length becomes significant.

There is therefore a need for an integrated circuit and for an integrated circuit design method whereby increasing the length of the test sequence for controllers and other sequential circuits can be suppressed, high fault coverage can be achieved, and testing at the actual operating speed can be achieved.

SUMMARY OF THE INVENTION

To meet the above described need, an object of the present invention is to provide an integrated circuit having a sequential circuit describable as a finite state machine, comprising a state register and combinational circuit, and controllable to a reset state by inputting a reset signal thereto.

To this end, the integrated circuit comprises a mode selection means enabling selection of a specific state transition mode for effecting state transitions different from the state transitions of the finite state machine; an invalid-state generation logic circuit for changing to all selectable invalid states on a state transition path when a specific state transition mode is selected by the mode selection means, based on a process for generating a set of test patterns by applying a specific test generation algorithm to the combinational circuit on an assumption that state register states are controllable and observable, and determining a state transition path passing through all invalid states indicated by a test pattern part corresponding to a state register setting in each test pattern of a test pattern set, said invalid state being defined as any state expressible by the state register but not directly selectable from the reset state of the finite state machine; and a primary observation output for externally observing each signal input to the state register as a signal indicating a value to which the state register is to be set.

A further object of the invention is to provide a design-for-testability method for an integrated circuit having a sequential circuit describable as a finite state machine having a finite number of states, including a reset state.

To this end, the design-for-testability method comprises a logic circuit generating step for generating a logic circuit comprising a state register and a combinational circuit by logic synthesis of a finite state machine described at a register transfer level; a test pattern set generating step for generating a set of test patterns by applying a specific test generation algorithm to said combinational circuit using an assumption that state register states are controllable and observable; a transition-resistant valid state detection step for detecting as a transition-resistant valid state a valid states where the transition sequence required to select that state exceeds a predefined length, or the processing time required to determine a transition sequence for selecting that state exceeds a predefined limit, such valid state being defined as any state directly selectable by the finite state machine from a reset state thereof; a state transition path determining step for determining a state transition path passing all transition-resistant valid states and all invalid states indicated by a test pattern part corresponding to a state register setting in each test pattern of a test pattern set, such invalid state being defined as any state expressible by the state register but not directly selectable from the reset state of the finite state machine; and an adding step for generating an invalid-state generation logic circuit for changing to all selectable invalid states and transition-resistant valid states on the state transition path, and adding the invalid-state generation logic circuit to the sequential circuit.

A further object of the invention is to provide a computer-readable recording medium for recording a program for designing a testable integrated circuit having a sequential circuit describable as a finite state machine, comprising a state register and combinational circuit, and controllable to a reset state by inputting a reset signal thereto.

To this end, the computer-readable recording medium records a program for executing steps including: a logic circuit generating step for generating a logic circuit comprising a state register and a combinational circuit by logic synthesis of a finite state machine described at a register transfer level; a test pattern set generating step for generating a set of test patterns by applying a specific test generation algorithm to such combinational circuit using an assumption that state register states are controllable and observable; a state transition path determining step for determining a state transition path passing all invalid states indicated by a test pattern part corresponding to a state register setting in each test pattern of a test pattern set, such invalid state being defined as any state expressible by the state register but not directly selectable from the reset state of the finite state machine; and an adding step for generating an invalid-state generation logic circuit for changing to all selectable invalid states on the state transition path, and adding said invalid-state generation logic circuit to the sequential circuit.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which:.

FIG. 2 is a state diagram of a finite state machine representing the controller that is the device under design in the first embodiment of the invention;

FIG. 3 is a logic level block diagram of the controller that is the device under design in the first embodiment of the invention;

FIG. 4 is a table of state assignments for the controller that is the device under design in the first embodiment of the invention;

FIG. 8 is a table of test patterns resulting from test generation for the combinational circuit of the first embodiment of the invention;

FIG. 9 is a table of the properties of the MCNC '91 FSM benchmark used for evaluating the design-for-testability method (present method) of the first embodiment of the invention, the results of logic synthesis, and the results of test generation using a sequential circuit test generation algorithm applied to the sequential circuit obtained from logic synthesis;

FIG. 10 shows the results of test generation using the conventional full-scan and non-scan methods, and the method of the present invention with the MCNC '91 FSM benchmark;

FIG. 11 shows the relative spatial overhead of the method of the present invention and conventional full-scan and non-scan methods with the MCNC '91 FSM benchmark;

FIG. 15 is a block diagram of a logic circuit obtained by a design-for-testability method according to a third alternative version of the first and second embodiments of the invention;

FIG. 16 is a block diagram of a logic circuit obtained by a design-for-testability method according to a fourth alternative version of the first and second embodiments of the invention;

FIG. 17 shows an area comparison of the invalid-state generation logic circuit obtained by applying the above design-for-testability method according to a fourth alternative version to the MCNC '91 FSM benchmark;

DESCRIPTION OF THE PREFERRED EMBODIMENTS

An exemplary embodiment of the present invention is described below with reference to the accompanying figures.

1. Embodiment 1
1.1 Design-For-Testability

Figure 1:
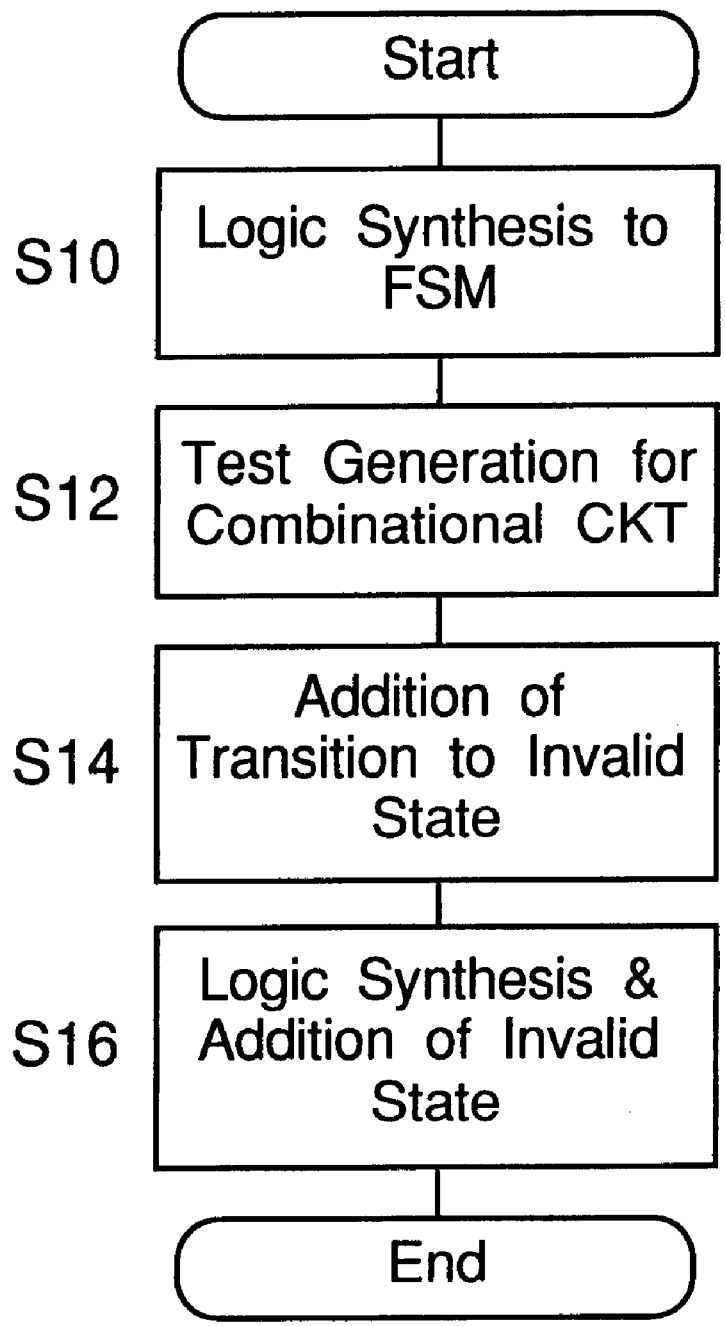
FIG. 1 is a flow chart showing an integrated circuit design-for-testability method according to a first embodiment of the present invention.

FIG. 1 is a flow chart of a design-for-testability method for integrated circuits according to a first exemplary embodiment of the present invention. The present embodiment addresses the design of a controller embodied in an integrated circuit where the controller is described as a finite state machine at the register transfer level as shown in FIG. 2. Note that in FIG. 2 the symbols sj represent the states of the finite state machine where j is a value 0 to 6.

The design method of the invention starts in step S10 of FIG. 1 by applying logic synthesis to the finite state machine (FSM), which is supplied as a description of the controller that is the device under design. The result of this step is a logic level description of a circuit corresponding to the controller (referred to below as the "controller logic circuit").

As shown in FIG. 3, this controller logic circuit comprises a state register 12, combinational logic circuit 14, and next-state generation logic circuit 10, and external contacts for controlling the primary input PI, observing the primary output PO, and applying a reset signal R.

During the logic synthesis of step 10, each of the states of the FSM must be assigned a value in the state register 12. The state register 12 in the present embodiment comprises seven flip-flops, and the results of this state assignment (the state assignment data) are shown in FIG. 4.

Figure 5:
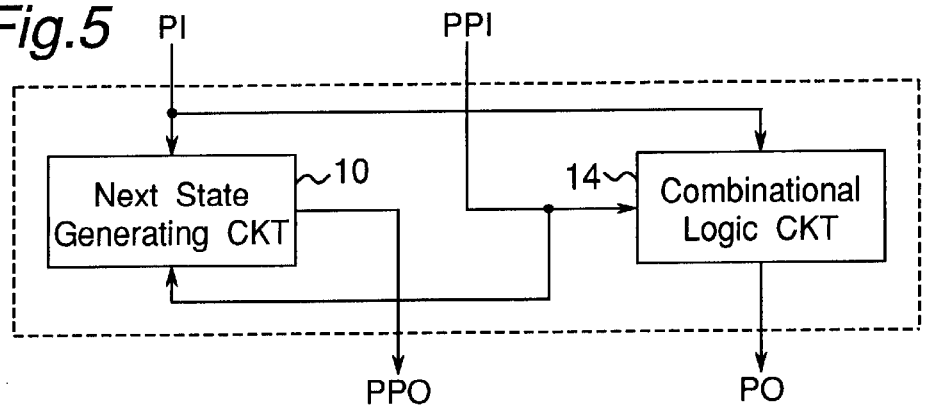
FIG. 5 is a block diagram of a combinational circuit for which tests are generated during the design-for-testability process of the first embodiment of the invention.

Once this controller logic circuit is obtained, a test pattern set is generated in step S12 for the combinational circuit comprising just the next-state generation logic circuit 10 and combinational logic circuit 14, that is, not including the state register 12, by applying a specific test pattern generation algorithm. This combinational circuit is referred to below as the ATPG (algorithmic test pattern generation) circuit The ATPG circuit is shown in FIG. 5. During test pattern generation in step 12, the signal values output from the next-state generation logic circuit 10 in the circuit shown in FIG. 3 and applied to the state register 12 are treated as observable pseudo-primary outputs PPO. The signal levels asserted to the state register 12 and applied to the combinational logic circuit 14 in FIG. 3 are treated as controllable pseudo-primary inputs PPI. Each of the test patterns in the test pattern set generated in step 12 thus comprises both primary input PI and pseudo-primary input PPI values.

In general, the number of states expressible by the state register is $2^n$ where n is the number of flip-flops constituting the state register of the controller and obtained by logic synthesis. In the present embodiment, therefore, the number of expressible states is $2^7$.

These $2^n$ states include states that can be set directly from the original reset state s0 of the FSM ("valid states" below), and states that cannot be set directly from the original reset state s0 of the FSM ("invalid states" below).

Each of the test patterns in the test pattern set generated in step S12 contains a pseudo-primary input PPI, which corresponds to a value in the state register 12.

As a result, each test pattern set can have test patterns ("valid-state test patterns" below) containing state register values representing a valid state (pseudo-primary input PPI value), and test patterns ("invalid-state test patterns" below) containing state register values representing an invalid state.

Figure 6:
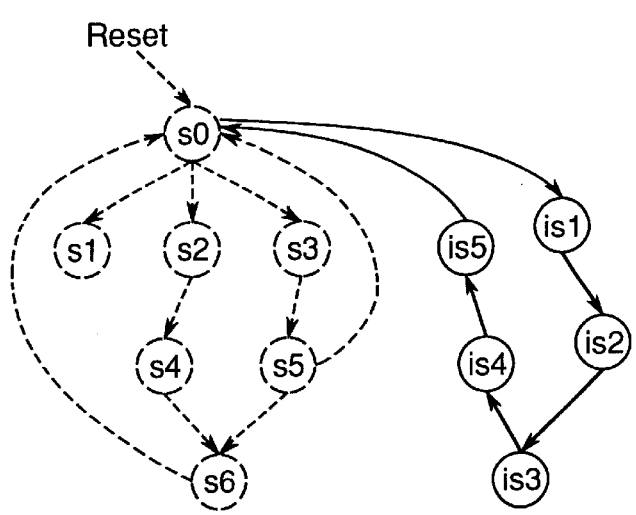
FIG. 6 is a state diagram showing the state transitions added to the finite state machine in the first embodiment of the invention.

The next step S14 determines all invalid states contained in any test pattern in the test pattern set. A state transition path starting from the reset state and passing all of the invalid states is then determined, a state transition mode selection signal t is then inserted, and a state transition whereby each of the invalid states can be passed via the selected state transition path when t=1 is added to the original FSM (when t=0, the FSM changes valid states). The result of step S14 is a controller FSM as shown in FIG. 6. The path indicated by the solid line in FIG. 6 corresponds to the added state transitions; is1—is5 are symbols for invalid states.

Figure 7:
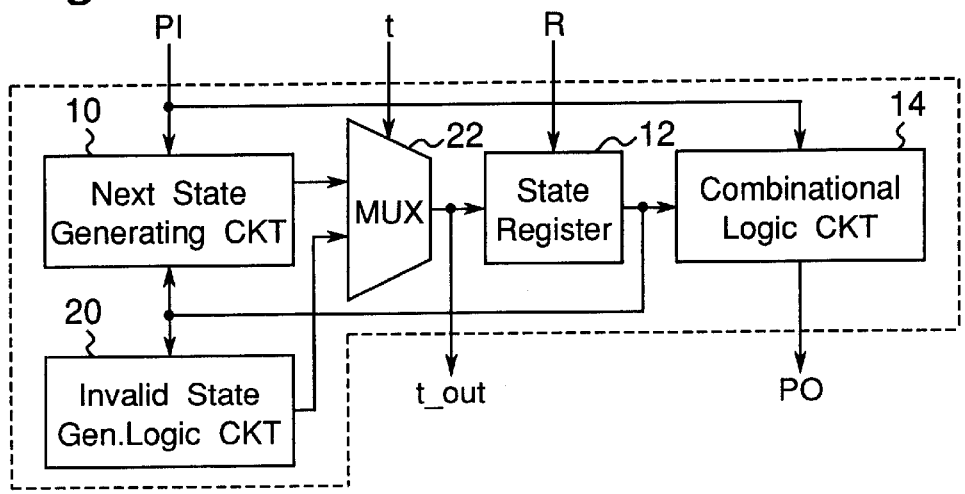
FIG. 7 is a block diagram of a logic circuit (testable logic circuit) obtained by the design-for-testability method of the first embodiment of the invention.

Logic synthesis of only the state transition path added to the original FSM is then performed in step S16. The resulting logic circuit is then added to the controller logic circuit derived in step S10. To ensure that the pseudoprimary outputs PPO in the ATPG circuit (FIG. 5) are observable, they are output in the form of a state output signal t_out. The resulting testable logic circuit is shown in FIG. 7. Note that this testable logic circuit additionally comprises an invalid-state generation logic circuit 20 and a multiplexer 22, as well as a primary contact for applying a state transition mode selection signal t from an external source as a control signal for the multiplexer 22, and a primary contact for observing the output of the multiplexer 22.

The invalid-state generation logic circuit 20 sequentially generates an invalid state each time a clock signal (not shown in the figures) is asserted according to the state transition path shown in FIG. 6. When the state transition mode selection signal t=0, the multiplexer 22 selects the signal asserted by the next-state generation logic circuit 10 (a valid state signal); when t=1, it selects the signal asserted by the invalid-state generation logic circuit 20 (an invalid state signal). The multiplexer 22 then applies the selected signal to the state register 12.

Figure 22:
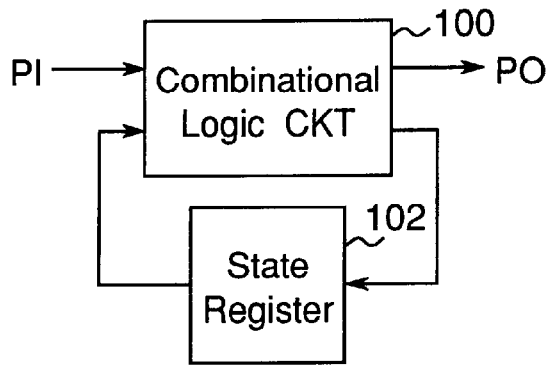
FIG. 22 is a block diagram of a controller or other sequential circuit.
Figure 23:
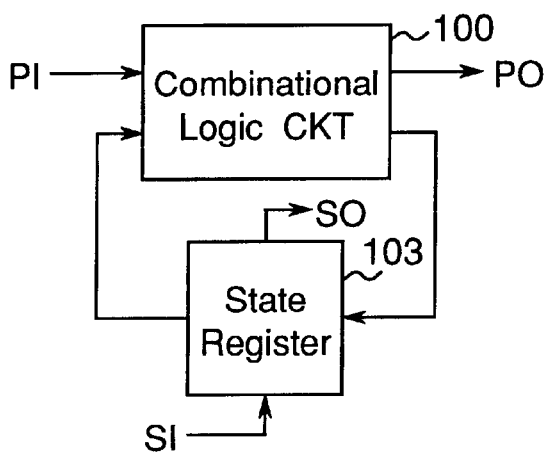
FIG. 23 is a block diagram of a logic circuit obtained by applying a conventional scanning method to a sequential circuit as shown in FIG. 22.
Figure 24:
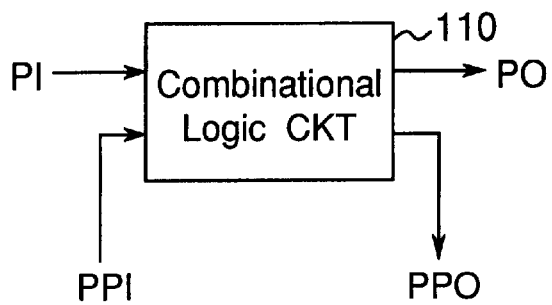
FIG. 24 shows a combinational circuit for which test patterns are generated by applying a conventional scanning method to a sequential circuit.
Figure 25:
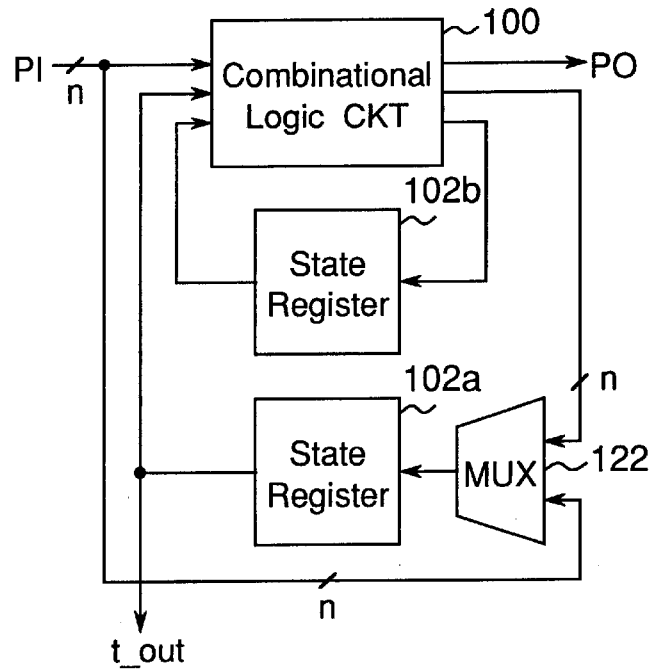
FIG. 25 shows a combinational circuit for which test patterns are generated by applying a conventional non-scanning method to a sequential circuit.
Figure 26:
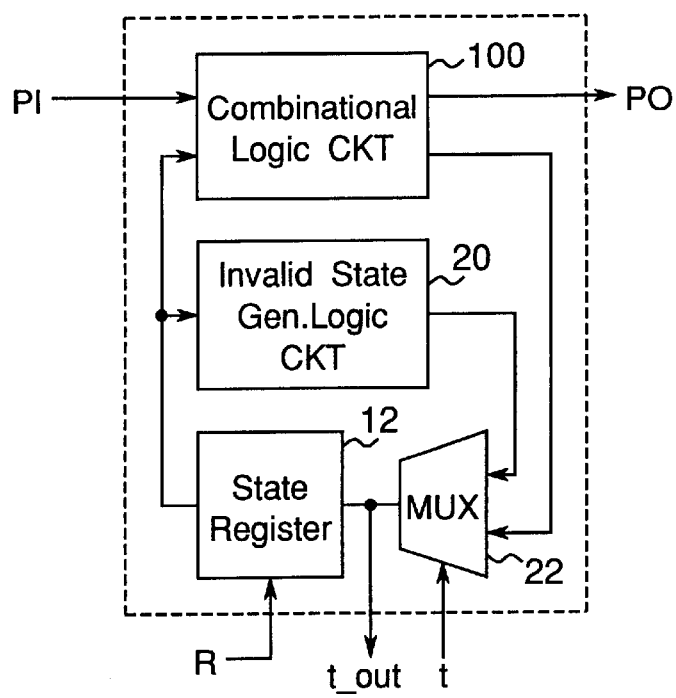
FIG. 26 is a block diagram of a testable logic circuit obtained from the design-for-testability method of the first embodiment of the invention assuming a circuit configuration as shown in FIG. 22.

In order to create the testable logic circuit shown in FIG. 7, the controller logic circuit obtained from logic synthesis of the FSM supplied as the device under development is assumed to comprise a state register 12, combinational logic circuit 14, and next-state generation logic circuit 10 as shown in FIG. 3. It is alternatively possible, however, for the controller logic circuit to be comprised as shown in FIG. 22, that is, comprising the combinational logic circuit 14 and next-state generation logic circuit 10 in a single combinational circuit 100. In this case, the ATPG circuit for which the test pattern set is generated in step S12 is as shown in FIG. 24, and the testable logic circuit resulting from the procedure shown in FIG. 1 is as shown in FIG. 26. Note that the same parts in the testable logic circuits in FIG. 26 and FIG. 7 are indicated using the same reference symbols.

It will also be obvious from the description following further below that design-for-testability is possible using a controller logic circuit as shown in FIG. 22 in place of that shown in FIG. 3. This is described in the second embodiment of the invention, and the various alternative versions of the preferred embodiments described below.

1.2 Testing

When a controller is manufactured as an integrated circuit based on the design result (see FIG. 7) obtained from the design-for-testability methodology described above, the integrated circuit is subject to functional testing.

To accomplish this, the test patterns generated in step 312 are separated into valid state test patterns and invalid state test patterns as shown in FIG. 8. Functional testing of an integrated circuit based on the design-for-testability methodology of the present embodiment comprises two components: applying test sequences corresponding to valid state test patterns, and applying test sequences corresponding to invalid state test patterns.

(1) Applying Test Sequences for Valid State Test Patterns

The state transition mode selection signal t is first set to t=0, and a state transition sequence for changing from the reset state to a valid state is applied. As a result, the state register 12 is set to a valid state contained in that test pattern (the state register value is set). Next, the value of a primary input PI contained in the applied test pattern is asserted from the primary input contact.

This test sequence assertion (that is, setting the state register value and asserting a primary input PI) is performed for every test pattern containing a valid state generated in step S12 (test patterns 1–k in FIG. 8). As each test sequence is applied, the resultant primary output PO and state output signal t_out are observed, and the observed values are compared with those expected for the corresponding test pattern. Note that the state output signal t_out is equivalent to the pseudo-primary output PPO of the ATPG circuit (FIG. 5) for which the test patterns were generated in step S12.

In general, when there are test patterns having the same state register value (the same state register 12 state), such as shown in test patterns 1 and 2 in FIG. 8, sequential primary input PI values can be asserted by holding the state register 12 at the same state. This makes it possible to shorten the test sequence length. As a result, the test sequence length corresponding to all test patterns containing a valid state is at most $\Sigma$(no. of state transition sequences){state transition sequence length}+{no. of test patterns containing a valid state} where $\Sigma$ is the summation symbol, and $\Sigma$ (no. of state transition sequences){state transition sequence length} means the sum of the state transition sequence length until a change to each valid state, plus the number of state transition sequences for all valid states.

The length of the state transition sequence from a reset state can also be shortened if state transitions between state register states in plural test patterns are possible as shown, for example, by a transition from state s3 to state s5 in FIG. 2. As a result, the test sequence length can also be shortened.

In the above methodology a state transition sequence effecting a transition to a valid state contained in the test pattern is asserted for each test pattern. Alternatively, however, it is possible to obtain the state transition path passing all valid states contained in each test pattern generated in step S12, assert a transition sequence for changing to each valid state according to the state transition path, and during this transition process assert the primary inputs PI included in the test patterns containing each of these valid states. Note, however, that the optimum state transition path used in this method will be the shortest path passing preferably only once through every valid state in each test pattern, and obtaining this shortest path presents the so-called problem of the travelling salesman.

(2) Applying Test Sequences for Invalid State Test Patterns

The state transition mode selection signal t is first set to t=1, and the invalid-state generation logic circuit 20 asserts a direct transition to the invalid states contained in each test pattern. The state register 12 is thereby set to an invalid state contained in the test pattern (the state register value is set).

Next, the value of the primary input PI contained in the applied invalid-state test pattern is asserted from the primary input contact.

This test sequence assertion (that is, setting the state register value and asserting a primary input PI) is performed for every test pattern containing an invalid state generated in step S12 (test patterns k+1+k+m in FIG. 8). As each test sequence is applied, the resultant primary output PO and state output signal t_out are observed, and the observed values are compared with those expected for the corresponding test pattern.

Because each invalid state can be directly set by the invalid-state generation logic circuit 20, the total of the lengths of the state transition sequences effecting an invalid state is the number of invalid states in the test pattern. The test sequence length corresponding to all test patterns containing an invalid state is therefore {no. of invalid states in test pattern}+{no. of test patterns having an invalid state} and in the worst case is twice the number of test patterns containing an invalid state.

It should be noted that the invalid-state generation logic circuit 20 is not used during normal circuit operation. It can therefore be sufficiently tested by simply confirming that invalid states can be generated according to the state transition path selected in step S14. This confirmation can be accomplished by monitoring the state output signal t_out.

1.3 Comparing the Proposed Methodology with Conventional Techniques

Results of the design-for-testability methodology of the present embodiment (the "present method" below) applied to the MCNC '91 FSM benchmark (see Yang, S., "Logic Synthesis and Optimization Benchmarks User Guide Version 3.0") are compared with a conventional full-scan design-for-testability methodology (the "full-scan method" below) and the non-scan design-for-testability method of Chickermane et al. (the "non-scan method" below).

Mentor Graphic Corp.'s "AutoLogic II" (R) logic synthesis program was used to gather data indicative of the results obtained by applying these three methods to the MCNC '91 FMS benchmark. "Test Gen" (R) from Sun Rise Test Systems, Inc. was the computer program used to run the test pattern generating algorithm. Both programs were run on a Fujitsu SS20(R) workstation.

The FSM benchmark properties used for the present comparison, the results of logic synthesis of these FSM benchmarks, and the results of test generation using a sequential circuit test generation algorithm applied to the sequential circuit resulting from logic synthesis, are shown in FIG. 9.

FIG. 10 shows the results of test generation using the full-scan method, non-scan method, and present method. As will be known from FIG. 10, the test generation time and fault coverage of the present method are identical to those of the full-scan method, but the test sequence length is shorter than that of both the full-scan and non-scan methods.

FIG. 11 shows the area overhead of the three compared methods. The multiplexer overhead of the present method is the same as that of the full-scan method, but greater than that of the non-scan method. An invalid-state generation logic circuit is present only in the present method. Note that the area unit of the invalid-state generation logic circuit shown in FIG. 11 is the number of gates; values in parentheses indicate the percentage of the circuit area shown in FIG. 9.

1.4 Effect

Unlike the full-scan method, the design-for-testability methodology of the present embodiment does not use the state register as a scannable state register. Instead, the present method directly sets the flip-flops constituting the state register 12 to the state register values required for the test, and can therefore run the test at the actual operating speed.

As will also be known from the above-noted comparison, the present method obtains full fault coverage, as does the full-scan method, while minimizing the test sequence length, and actually shortening the test sequence length compared with those of the full-scan and non-scan methods.

2. Embodiment 2

Figure 12:
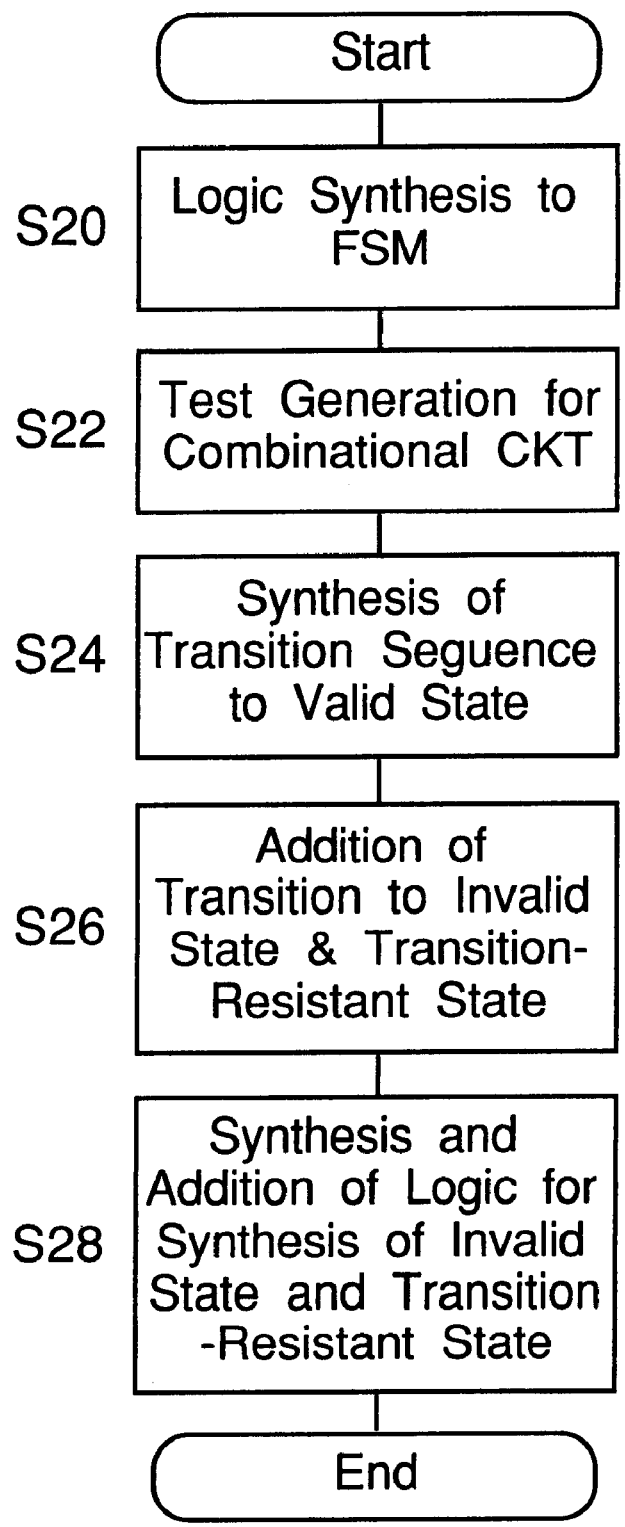
FIG. 12 is a flow chart showing an integrated circuit design-for-testability method according to a second embodiment of the present invention.

FIG. 12 is a flow chart of an integrated circuit design-for-testability methodology according to a second embodiment of the present invention. As with the method of the first embodiment described above, the method of this second embodiment is also addressed to the design of a controller (see FIG. 2).

The method of the second embodiment also starts, in step S20 of FIG. 12, by applying logic synthesis to the finite state machine (FSM) supplied as a description of the controller that is the device under design. The result of this step is a logic level description of a circuit corresponding to the controller (referred to below as the "controller logic circuit"; see FIG. 3).

A test pattern set is then generated in step S22 for the combinational circuit not including the state register 12, that is, comprising just the next-state generation logic circuit 10 and combinational logic circuit 14, by applying a specific test pattern generation algorithm thereto. As above, this combinational circuit is referred to below as the ATPG (algorithmic test pattern generation) circuit.

The next step S24 generates a transition sequence for changing to each valid state contained in the test patterns of the test pattern set. During the process of generating this transition sequence it is also determined for each state whether it is difficult to transfer to that state. More specifically, a maximum transition sequence length is pre-defined. If the transition sequence required for a transfer to a particular valid state is longer than this predefined length, that valid state is detected to be transition resistant (a "transition-resistant valid state" below).

Alternatively, a maximum transition sequence generation time is predefined. In this case, any valid state for which the time required to generate a transition sequence thereto exceeds the predefined maximum time is detected to be a transition-resistant valid state.

The next step S26 detects all invalid states contained in any test pattern in the test pattern set. A state transition path starting from the reset state and passing all of the invalid states and transition-resistant valid states is then determined. A state transition mode selection signal t is then inserted, and a state transition whereby each of the invalid states and transition-resistant valid states can be passed via the selected state transition path when t=1 is added to the original FSM (when t=0, the FSM changes valid states). The result of step S14 is a controller FSM as shown in FIG. 6.

Logic synthesis of only the state transition path added to the original FSM is then performed in step S28. The resulting logic circuit is then added to the controller logic circuit derived in step S20. To ensure that the pseudo-primary outputs PPO in the ATPG circuit (FIG. 5) are observable, they are output in the form of a state output signal t_out. The resulting testable logic circuit is shown in FIG. 7, as in the first embodiment above. Note, however, that the invalid-state generation logic circuit 20 of the present embodiment generates both invalid states and transition-resistant valid states contained in the test pattern set, that is, each time the clock signal (not shown in the figures) is asserted, the invalid-state generation logic circuit 20 sequentially outputs an invalid state or a transition-resistant valid state according to the state transition path selected in step S26.

As also described above, a controller manufactured as an integrated circuit based on the design result obtained from the design-for-testability methodology described above is subject to functional testing. This is accomplished in two parts: applying test sequence for test patterns containing valid states but not transition-resistant valid states, and applying test sequences for test patterns containing invalid states and test patterns containing transition-resistant valid states. The first of these is accomplished using the same procedure described in the first embodiment above under "(1) Applying test sequences for valid state test patterns", and the second using the procedure described under "(2) Applying test sequences for invalid state test patterns."

With the method of the above second embodiment, transition-resistant valid states can be set directly by the invalid-state generation logic circuit 20 without including in the test sequence a state transition sequence for changing the states of the controller being tested to transition-resistant valid states. An increase in the test sequence length can therefore be avoided when states that are difficult to set are included in the test patterns generated in step S22.

Figure 13:
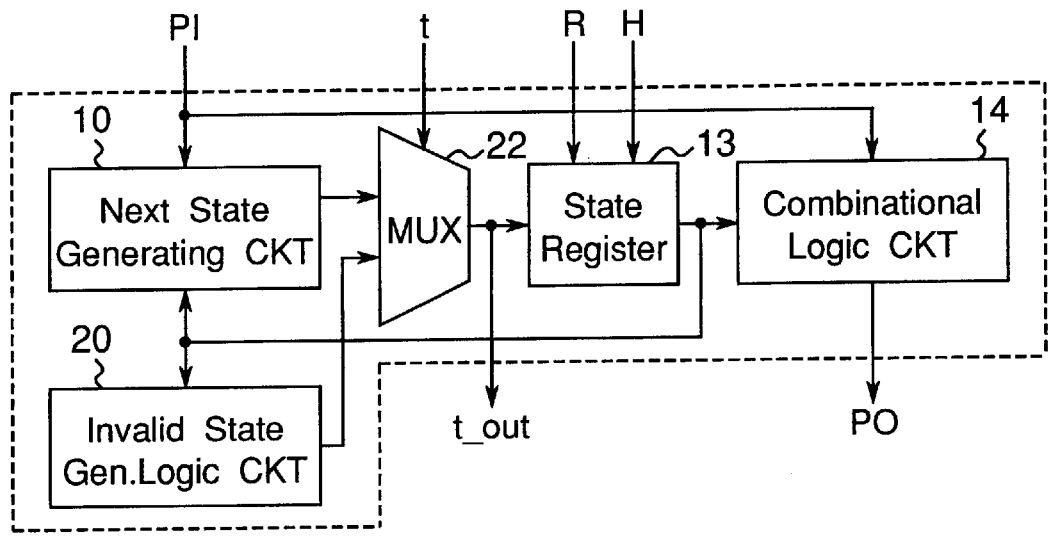
FIG. 13 is a block diagram of a logic circuit obtained by a design-for-testability method according to a first alternative version of the first and second embodiments of the invention.

3. Alternative Versions 3.1 Alternative Version 1 (FIG. 13)

During functional testing of the testable logic circuit of the first or second embodiments above, sequential primary inputs PI can be asserted one after the other if the state of the state register 12 is held constant when there is more than one test pattern having the same state register 12 state (state register value). As a result, the overall length of test sequences for a complete test is shortened.

This can be accomplished by adding a primary input contact for applying a hold signal H to the state register 12 such that the state to which the state register 12 is set is held irrespective of a change in the signal state input to the state register 12 while the hold signal H is high (active). More specifically, assertion of a clock signal or load enable signal to the state register is prevented when the hold signal H is asserted high (active).

Figure 14:
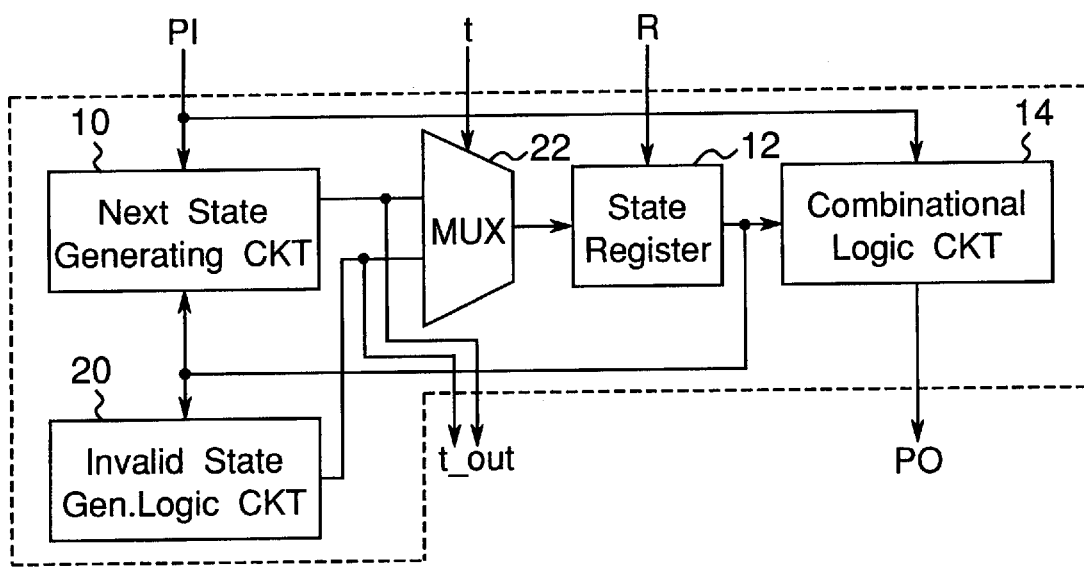
FIG. 14 is a block diagram of a logic circuit obtained by a design-for-testability method according to a second alternative version of the first and second embodiments of the invention.

3.2 Alternative Version 2 (FIG. 14)

To detect faults during the functional testing of the testable logic circuit of the first or second embodiments above, a test sequence is applied and the resultant primary output PO is observed, the pseudo-primary output PPO of the ATPG circuit (FIG. 5) for which the test was generated in step S12 or S22 is observed as the state output signal t_out, and the observed results are compared with the expected results. The output signal from the multiplexer 22 is used as the state output signal t_out in this implementation (see FIG. 7 and FIG. 13).

When a test sequence corresponding to a test pattern containing an invalid state or a transition-resistant valid state is applied, the state transition mode selection signal t is set to t=1, and the multiplexer 22 selects the output signal of the invalid-state generation logic circuit 20. To observe the state output signal t_out, which is detected as being equivalent to the pseudo-primary output PPO, however, the state transition mode selection signal t must be set temporarily to t=0 and the multiplexer 22 controlled to select the output from the next-state generation logic circuit 10.

Alternatively, however, primary contacts for directly detecting the input signal to the multiplexer 22, that is, the signals asserted thereto by the next-state generation logic circuit 10 and invalid-state generation logic circuit 20, can be added as shown in FIG. 14, and these signals can then be detected as the state output signals t_out.

This configuration increases the number of external contacts, but eliminates the need to reset the state transition mode selection signal t and change the input to the multiplexer 22 in the course of tests using test patterns containing an invalid state or transition-resistant valid state.

The output from the invalid-state generation logic circuit 20 is thus also rendered directly observable by observing the state output signal t_out, thereby making it easy to check the operation of the invalid-state generation logic circuit 20.

3.3 Alternative Version 3 (FIG. 15)

The present alternative version is a combination of alternative versions 1 and 2 above. More specifically, as shown in FIG. 15, a primary input contact for applying a hold signal H to the state register 12 is added to the configuration shown in FIG. 14 as in the first alternative version shown in FIG. 13. As a result, the state to which the state register 12 is set can be held irrespective of a change in the signal state asserted to the state register 12 while the hold signal H is high (active).

Testing is therefore more efficient when there is more than one test pattern having the same state register 12 state (state register value) in the test pattern set generated in step S12 or S22.

3.4 Alternative Version 4 (FIG. 16)

As described above, the non-scan method of Chickermane et al. is able to directly set some of the flip-flops in the state register from a primary input. The present alternative version is the design-for-testability methodology of the above first or second embodiment to which this concept of the non-scan method is introduced.

As shown in FIG. 16, the state register 12 of the present version 4 comprises two sections, a first comprising flip-flops that are directly controllable from a primary input PI, and a second comprising flip-flops that are not directly satiable from a primary input PI. The multiplexer is therefore divided into a first multiplexer 25 for asserting a signal to the first part of the state register 12, and a second multiplexer 26 for asserting a signal to the second part of the state register 12.

With this configuration the state register 12 can be set to an invalid state by means of the invalid-state generation logic circuit 20 generating a setting for the flip-flops in the second part of the state register 12 only. The area of the invalid-state generation logic circuit 20 can thus be reduced compared with the preceding embodiments and alternative version. This will also be obvious from a comparison of the area of the invalid-state generation logic circuit 20 shown in FIG. 11, and the area of the invalid-state generation logic circuit 20 shown in FIG. 17.

Note that FIG. 17 shows the area of the invalid-state generation logic circuit 20 when the present alternative version is applied to the above-noted MCNC '91 FSM benchmark.

Figure 18:
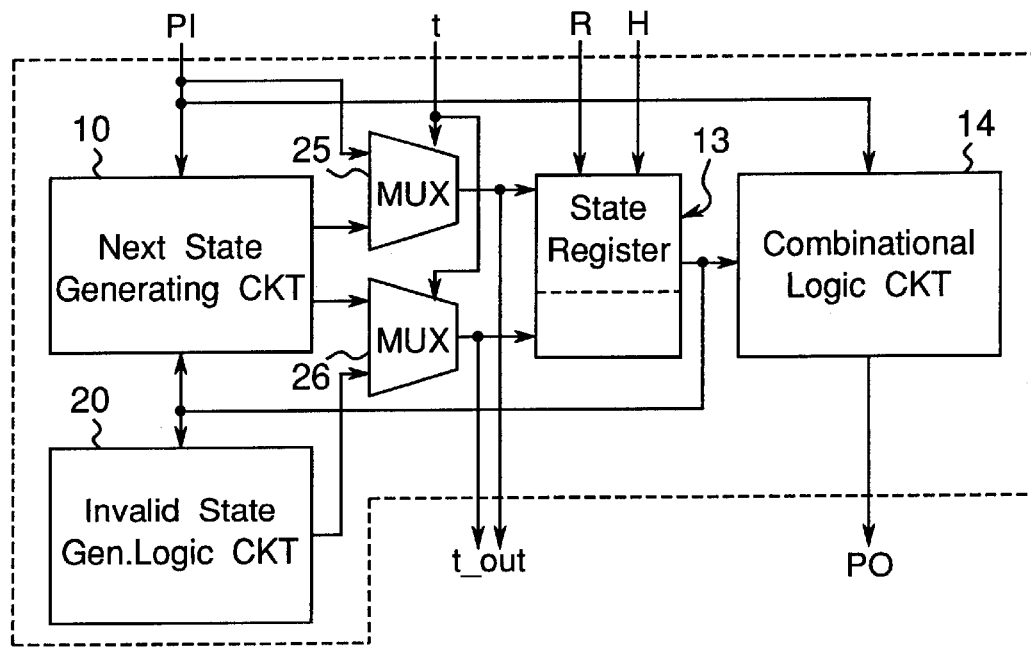
FIG. 18 is a block diagram of a logic circuit obtained by a design-for-testability method according to a fifth alternative version of the first and second embodiments of the invention.

3.5 Alternative Version 5 (FIG. 18)

The present alternative version is a combination of alternative versions 1 and 4 above. More specifically, as shown in FIG. 18, a primary input contact for applying a hold signal H to the state register 12 is added to the configuration shown in FIG. 16 as in the first alternative version shown in FIG. 13. As a result, the state to which the state register 12 is set can be held irrespective of a change in the signal state asserted to the state register 12 while the hold signal H is high (active).

As described above, testing is therefore more efficient when there is more than one test pattern having the same state register 12 state (state register setting) in the test pattern set.

Figure 19:
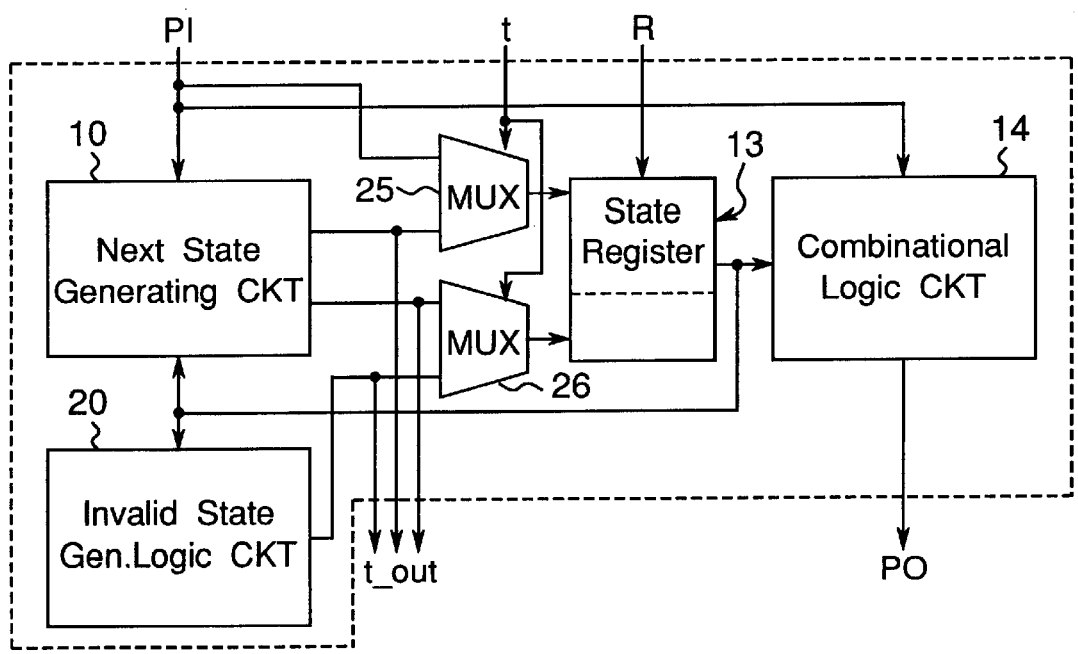
FIG. 19 is a block diagram of a logic circuit obtained by a design-for-testability method according to a sixth alternative version of the first and second embodiments of the invention.

3.6 Alternative Version 6 (FIG. 19)

The present alternative version is a combination of alternative versions 2 (FIG. 14) and 4 (FIG. 16) above. More specifically, the present version is comprised to enable direct detection of the input signals (that is, the outputs of the next-state generation logic circuit 10 and invalid-state generation logic circuit 20) to both of the multiplexers 25 and 26 as state output signals t_out. See FIG. 19.

This configuration increases the number of external contacts, but eliminates the need to reset the state transition mode selection signal t and change the input to the multiplexer 22 in the course of tests using test patterns containing an invalid state or transition-resistant valid state.

The output from the invalid-state generation logic circuit 20 is thus also rendered directly observable by observing the state output signal t_out, thereby making it easy to check the operation of the invalid-state generation logic circuit 20.

Figure 20:
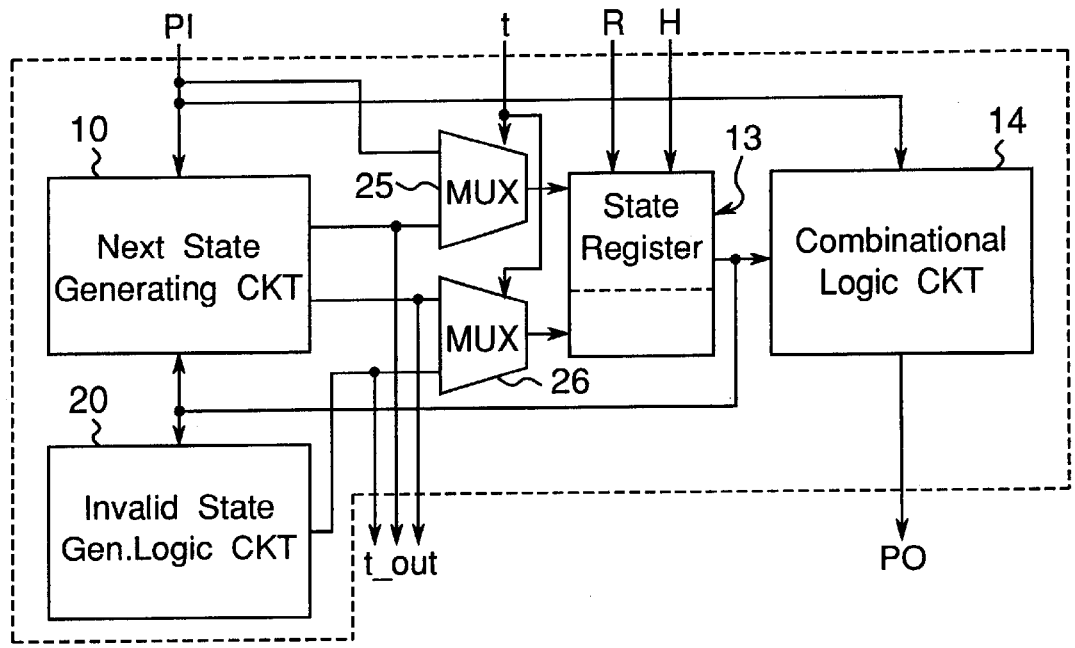
FIG. 20 is a block diagram of a logic circuit obtained by a design-for-testability method according to a seventh alternative version of the first and second embodiments of the invention.

3.7 Alternative Version 7 (FIG. 20)

This version is further obtained by adding to the configuration shown as version 6 in FIG. 19 a primary input contact for applying a hold signal H to the state register 12 as in the first alternative version shown in FIG. 13. See FIG. 20. As a result, the state to which the state register 12 is set can be held irrespective of a change in the signal state asserted to the state register 12 while the hold signal H is high (active).

As described above, testing is therefore more efficient when there is more than one test pattern having the same state register 12 state (state register setting) in the test pattern set.

Figure 21:
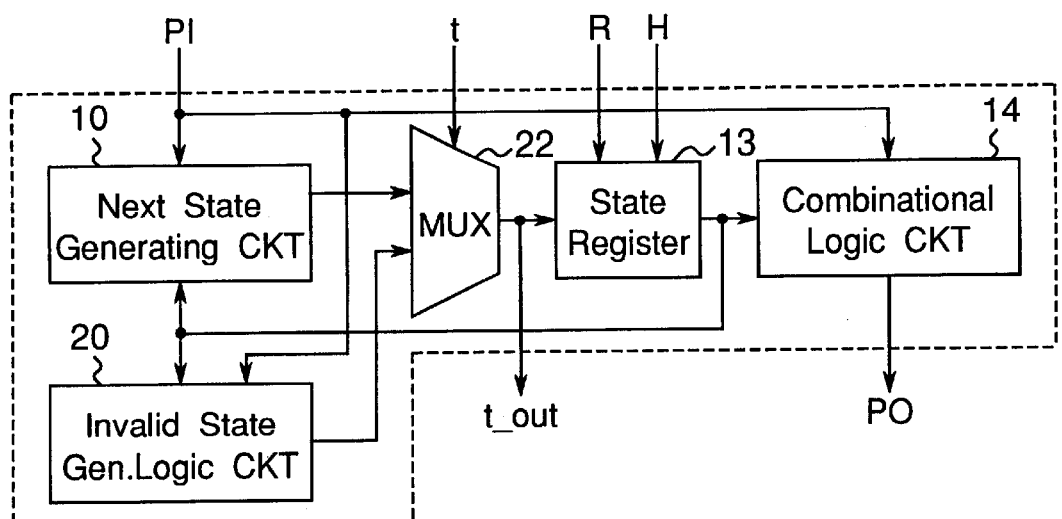
FIG. 21 is a block diagram of a logic circuit obtained by a design-for-testability method according to n eighth alternative version of the first and second embodiments of the invention.

3.8 Alternative Version 8 (FIG. 21)

In the configuration shown in FIG. 7, the state register 12 output is applied directly to the invalid-state generation logic circuit 20. Based on the current state asserted from the state register 12, the invalid-state generation logic circuit 20 then generates a signal indicative of the next state, that is, the signal to be asserted to the state register 12.

In the present alternative version shown in FIG. 21, however, both a primary input PI and the output signal from the state register 12 are supplied to the invalid-state generation logic circuit 20, and the invalid-state generation logic circuit 20 thus generates the next state signal based on both the current state and the primary input PI.

The fourth alternative version shown in FIG. 16 can be thought of as another implementation of the present alternative version. That is, the primary input PI is asserted directly to one multiplexer 25 in the fourth alternative version. However, if the primary input PI is considered to be input directly to the invalid-state generation logic circuit 20 and passed thereby directly to the first multiplexer 25, the result will be a configuration as shown in FIG. 21.

4. Media for Distributing an Integrated Circuit Design-For-Testability Program The integrated circuit design-for-testability method described in the above embodiments and versions of the present invention can be achieved by means of a workstation or other computer running a program implementing the steps shown in the flow charts of FIG. 1 or FIG. 12. Such a program can be distributed using any type of computer-readable medium including, but not limited to, floppy disks, magnetic tape, CD-ROM, and DVD media.

5. Effects of the Invention

When an invaid-state generation logic circuit for generating invalid states (or invalid states and transition-resistant valid states) contained in a test pattern for a combinational circuit not comprising a state register is added to an integrated circuit, and a test sequence corresponding to a test pattern having invalid states (or invalid states and transition-resistant valid states) is applied to the integrated circuit for testing, a state register can be set directly by the output signal from the invalid-state generation logic circuit. Increasing the length of the test sequence can therefore be avoided, and complete fault coverage can be achieved in tests of integrated circuits containing a controller or other sequential circuit.

Furthermore, tests can be run at the actual operating speed because the states required for testing can be set directly to the flip-flops constituting the state register from the internal circuitry, and the state register is not scanned, unlike with full-scan design-for-testability methods.

In addition, the valid states contained in the test patterns are set using the state transitions in normal operation. The spatial overhead incurred by the design-for-testability method of the invention is therefore relatively small because the only circuit elements added for testability are those required for setting the invalid states (or invalid states and transition-resistant valid states) contained in the test patterns.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. An integrated circuit having a sequential circuit describable as a finite state machine, comprising a state register and combinational circuit, and controllable to a reset state by inputting a reset signal thereto, said integrated circuit comprising:

a mode selection means enabling selection of a specific state transition mode for effecting state transitions different from the state transitions of the finite state machine;

an invalid-state generation logic circuit for changing to all selectable invalid states and transition-resistant valid states on a state transition path when a specific state transition mode is selected by the mode selection means, based on a process for generating a set of test patterns by applying a specific test generation algorithm to the combinational circuit on an assumption that state register states are controllable and observable, determining all invalid states indicated by a test pattern part corresponding to a state register setting in each test pattern of a test pattern set, said invalid state being defined as any state expressible by the state register but not directly selectable from the reset state of the finite state machine;

determining all transition-resistant valid states, defined as valid states where the transition sequence required to select that state exceeds a predefined length, or the processing time required to determine a transition sequence for selecting that state exceeds a predefined limit, said valid state being defined as any state directly selectable by the finite state machine from a reset state thereof, and determining a state transition path passing through all invalid states and transition-resistant valid states, and a primary observation output for externally observing each signal input to the state register as a signal indicating a value to which the state register is to be set.

2. The integrated circuit as set forth in claim 1, wherein the combinational circuit comprises a next-state generation circuit for generating a signal indicating a next state based on a current state, which is expressed by a value to which the state register is set;

the invalid-state generation logic circuit generates a signal input to the state register for changing to all selectable invalid states and transitionresistant valid states on the state transition path; and the mode selection means is a multiplexer for selecting and passing to the state register based on a specific selection signal externally asserted thereto either a signal generated by the next-state generation circuit or a signal generated by the invalid-state generation logic circuit.

3. The integrated circuit as set forth in claim 2, wherein the primary observation output is a terminal for passing externally an output signal from the multiplexer.

4. The integrated circuit as set forth in claim 2, wherein the primary observation output is a terminal for passing externally a signal input from the next-state generation circuit, and a signal input from the invalid-state generation logic circuit, to the multiplexer.

5. The integrated circuit as set forth in claim 1, further comprising a state-hold means for holding the state register to the presently held state even if the signal input to the state register changes based on a specific externally input signal.

6. The integrated circuit as set forth in claim 1, wherein the state register comprises a first flip-flop group and a second flip-flop group, and when a specific state transition mode is selected by the mode selection means, a value to be set to the first flip-flop group is supplied from an external input, and the value to be set to the second flip-flop group is supplied from the invalid-state generation logic circuit.

7. The integrated circuit as set forth in claim 6, wherein the combinational circuit comprises a next-state generation circuit for generating a signal indicating a next state based on a current state, which is expressed by a value to which the state register is set;

the invalid-state generation logic circuit generates a signal input to the state register for changing to all selectable invalid states, or all selectable invalid states and transition-resistant valid states, on the state transition path; and the mode selection means comprises a first multiplexer and a second multiplexer, and based on a specific selection signal externally asserted thereto, the first multiplexer selects and inputs to the first flip-flop group either a signal generated by the next-state generation circuit or a signal supplied as an external input, and the second multiplexer selects and inputs to the second flip-flop group either a signal generated by the next-state generation circuit or a signal generated by the invalid-state generation logic circuit.

8. The integrated circuit as set forth in claim 7, wherein the primary observation output is a terminal for passing externally a signal input from the next-state generation circuit to the first multiplexer, a signal input from the next-state generation circuit to the second multiplexer, and a signal input from the invalid-state generation logic circuit to the second multiplexer.

9. A design-for-testability method for an integrated circuit having a sequential circuit describable as a finite state machine having a finite number of states, including a reset state, said design-for-testability method comprising:

a logic circuit generating step for generating a logic circuit comprising a state register and a combinational circuit by logic synthesis of a finite state machine described at a register transfer level;

a test pattern set generating step for generating a set of test patterns by applying a specific test generation algorithm to said combinational circuit using an assumption that state register states are controllable and observable;

a transition-resistant valid state detection step for detecting as a transition-resistant valid state a valid state where the transition sequence required to select that state exceeds a predefined length, or the processing time required to determine a transition sequence for selecting that state exceeds a predefined limit, said valid state being defined as any state directly selectable by the finite state machine from a reset state thereof;

a state transition path determining step for determining a state transition path passing all transition-resistant valid states and all invalid states indicated by a test pattern part corresponding to a state register setting in each test pattern of a test pattern set, said invalid state being defined as any state expressible by the state register but not directly selectable from the reset state of the finite state machine; and an adding step for generating an invalid-state generation logic circuit for changing to all selectable invalid states and transition-resistant valid states on the state transition path, and adding said invalid-state generation logic circuit to the sequential circuit.

10. A computer-readable recording medium for recording a program for designing a testable integrated circuit having a sequential circuit describable as a finite state machine having a finite number of states, including a reset state, said computer-readable recording medium recording a program for executing steps including:

a logic circuit generating step for generating a logic circuit comprising a state register and a combinational circuit by logic synthesis of a finite state machine described at a register transfer level;

a test pattern set generating step for generating a set of test patterns by applying a specific test generation algorithm to said combinational circuit using an assumption that state register states are controllable and observable;

a transition-resistant valid state detection step for detecting as a transitionresistant valid state a valid state where the transition sequence required to select that state exceeds a predefined length, or the processing time required to determine a transition sequence for selecting that state exceeds a predefined limit, said valid state being defined as any state directly selectable by the finite state machine from a reset state thereof;

a state transition path determining step for determining a state transition path passing all transition-resistant valid states and all invalid states indicated by a test pattern part corresponding to a state register setting in each test pattern of a test pattern set, said invalid state being defined as any state expressible by the state register but not directly selectable from the reset state of the finite state machine; and an adding step for generating an invalid-state generation logic circuit for changing to all selectable invalid states and transition-resistant valid states on the state transition path, and adding said invalid-state generation logic circuit to the sequential circuit.

* * * * *